United States Patent
Kanemaru et al.

(10) Patent No.: US 7,723,817 B2
(45) Date of Patent: May 25, 2010

(54) SEMICONDUCTOR DEVICE AND MANUFACTURING METHOD THEREOF

(75) Inventors: Hiroshi Kanemaru, Miyazaki (JP); Naoki Kumagai, Nagano (JP); Yuichi Harada, Nagano (JP); Yoshihiro Ikura, Nagano (JP); Yoshiaki Minoya, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 111 days.

(21) Appl. No.: 11/420,779

(22) Filed: May 29, 2006

(65) Prior Publication Data

US 2007/0029636 A1 Feb. 8, 2007

(30) Foreign Application Priority Data

May 30, 2005 (JP) .............................. 2005-156517

(51) Int. Cl.
*H01L 29/00* (2006.01)

(52) U.S. Cl. .................. 257/510; 257/513; 257/538; 257/539; 257/565; 257/E21.642; 257/E21.703; 257/E21.111; 257/E29.295

(58) Field of Classification Search ................ 257/510, 257/513, 538, 539, 565, E21.642, E27.111, 257/E21.703, E29.295

See application file for complete search history.

(56) References Cited

U.S. PATENT DOCUMENTS

| | | | | |
|---|---|---|---|---|
| 3,656,034 A | * | 4/1972 | Rideout | 257/552 |
| 5,668,397 A | * | 9/1997 | Davis et al. | 257/520 |
| 5,807,784 A | * | 9/1998 | Kim | 438/423 |
| 6,524,890 B2 | | 2/2003 | Ueda et al. | |

FOREIGN PATENT DOCUMENTS

JP 2001-127149 A 5/2001

* cited by examiner

*Primary Examiner*—Wael Fahmy
*Assistant Examiner*—Marc Armand
(74) *Attorney, Agent, or Firm*—Rossi, Kimms & McDowell LLP

(57) ABSTRACT

The shape of a tip of an insulating material of an insulating isolation region is provided as being a concave one recessed below the back surface of an n-semiconductor substrate. This reduces the electric field strength at the corner at which the bottom of the n-semiconductor substrate is in contact with the insulating isolation region to allow an excellent breakdown voltage to be obtained. Moreover, by forming a high impurity concentration region such as a field-stop layer on the back surface of the n-semiconductor substrate, a depletion layer extending from the top surface is prevented from reaching the back surface. This eliminates an influence of a surface state introduced in the interface between the insulator film formed on the back surface and the n-semiconductor substrate, by which an excellent breakdown voltage can be obtained.

6 Claims, 10 Drawing Sheets

SEMICONDUCTOR DEVICE AND MANUFACTURING METHOD THEREOF

BACKGROUND

The present invention relates to a semiconductor device having an insulating isolation region and a manufacturing method thereof.

A semiconductor device having in a semiconductor substrate an electrically insulated isolation structure with an effect similar to that of an SOI (Silicon On Insulator) is known. See, for example, JP-A-2001-127149.

FIGS. 11 to 15 are cross sectional views showing a manufacturing method of a semiconductor device, having in a semiconductor substrate an electrically insulated isolation structure with an effect similar to that of an SOI, in the order of manufacturing steps about a principal part of the device. In the following explanations, the character "n" shows that a conduction type is an n-type and the character "p" shows that the conduction type is a p-type.

As the first manufacturing step, as shown in FIG. 11, in a top surface layer of an n-semiconductor substrate 51a, a p-well-region 52 is selectively formed. Moreover, on the top surface layer, a gate insulator film 53 is formed, on which gate electrodes 54 made of polysilicon are formed with one made positioned on the p-well region 52.

Then, as shown in FIG. 12, in the top surface layer of the n-semiconductor substrate 51a, high impurity concentration regions of a p-source region 55, a p-drain region 56 and an n-contact region 57 are formed. Furthermore, in the top surface layer of the p-well region 52, high impurity concentration regions of an n-source region 58, an n-drain region 59 and a p-contact region 60 are formed.

Next to this, as shown in FIG. 13, an interlayer insulator film 61 is formed. The interlayer insulator film 61 is then subjected to patterning and an isolating trench 62 is then formed from the top surface of the n-semiconductor substrate 51a toward inside thereof so as to surround the p-well region 52 and a group of the p-source region 55, the p-drain region 56 and the n-contact region 57. Thus, the top surface layer of the n-semiconductor substrate 51a is partitioned by the isolating trench 62 into partitioned n-semiconductor substrates 51b. Subsequent to this, the isolating trench 62 is filled with insulating material 63 to be formed as insulating isolation region 64.

Following this, as shown in FIG. 14, the top surface of the partitioned n-semiconductor substrate 51b is covered with an unillustrated interlayer insulator film. In the unillustrated interlayer insulator film, contact holes are opened through which metal electrodes are formed as a source electrode 65 electrically connected to the p-source region 55 and the n-contact region 57, a source electrode 67 electrically connected to the n-source region 58 and the p-contact region 60, a drain electrode 66 electrically connected to the p-drain region 56 and a drain electrode 68 electrically connected to the n-drain region 59. The surfaces of the metal electrodes are covered with a cap layer of a material such as polyimide film. The cap layer and the previously explained unillustrated interlayer insulator film are to be included in a film shown in the figure as an interlayer insulator film 69. In succession to this, the back surface of the partitioned n-semiconductor substrate 51b is subjected to cutting to make the partitioned n-semiconductor substrate 51b thinned until the insulating isolation region 64 is exposed. Thus, the partitioned n-semiconductor substrate 51b is divided into a plurality of substrates at the insulating isolation regions 64, by which a plurality of divided n-semiconductor substrates 51c are formed.

An assembly of a plurality of the divided n-semiconductor substrates 51c is referred to as an n-semiconductor substrate 51. The insulating material 63 at the bottom of each of the insulating isolation region 64 is made projected from a back surface 70 of the n-semiconductor substrate 51.

Next to this, as shown in FIG. 15, an insulator film 73 is formed on the back surface 70 of the n-semiconductor substrate 51 subjected to cutting to bury the tip 71 of the projected insulating material 63 in the insulator film 73. Finally, the insulator film 73 is adhered to a metal substrate 75 or a ceramic substrate by a conductive adhesive 74 to complete a semiconductor device.

With the insulating material 63 at the bottom of the insulating isolation region 64 made projected and the tip 71 of the projected insulating material 63 made buried in the insulator film 73 in this way, an arrangement can be provided which causes no occurrence of thickness variation and void production, both occurred when an SOI substrate was used, in the insulating material 63 filling the isolating trench 62 with no further occurrence of constricted part in the shape of the isolating trench 62. With thus provided arrangement, reduction in a breakdown voltage can be prevented.

In JP-A-2001-127149, it is also disclosed that characteristics (such as hfe and on-voltage) of a bipolar transistor can be improved by providing a low resistance layer with a material such as metal between the bottom of the n-semiconductor substrate 51 and the insulator film 73. The low resistance layer is formed over the whole back surface 70 of the divided n-semiconductor substrate 51c in the figure. However, it is supposed that the improvement in the characteristics can be also achieved even by partially forming the low resistance layer, though no explanation about this is given in JP-A-2001-127149.

For a method of making the insulating material 63 at the bottom of the insulating isolation region 64 projected from the back surface 70 of the n-semiconductor substrate 51 as described above, there is one in which polishing or etching of the n-semiconductor substrate 51a is carried out by controlling an etching selectivity between the n-semiconductor substrate 51a and the insulating material 63.

However, as shown in FIG. 15, in the structure in which the tip 71 of the insulating material 63 at the bottom of the insulating isolation region 64 projects from the back surface 70 of the n-semiconductor substrate 51, the tip 71 of the projecting insulating material 63 is liable to become a sharpened form after the etching of the back surface of the n-semiconductor substrate 51a. Thus, there is a problem of causing the projecting insulating material 63 to be cracked or chipped in a manufacturing process.

Moreover, in the processing of the back surface 70 of the n-semiconductor substrate 51, mechanical strain (defect layer) sometimes remains in a surface formed by polishing or etching and an interface state sometimes exists at the interface between the back surface 70 of the n-semiconductor substrate 51 and the insulator film 73. When a depletion layer extending in the direction of the back surface 70 of the divided n-semiconductor substrate 51c reaches the back surface 70 of the divided n-semiconductor substrate 51c, a current generated by the remaining mechanical strain and the existence of the interface state causes a leak current to increase, which results in reduction in a breakdown voltage.

Moreover, application of a negative surge voltage to the divided n-semiconductor substrate 51c causes an electric field to concentrate at a corner at which the bottom of the divided n-semiconductor substrate 51c is in contact with the insulating isolation region 64, which sometimes results in reduction in a breakdown voltage.

As shown in FIG. 16, an enlarged view of the section B in FIG. 14, in the structure in which the tip 71 of the insulating material 63 at the bottom of the insulating isolation region 64 projects, the shape of a corner 76 of the divided n-semiconductor substrate 51c in contact with the insulating isolation region 64 becomes convex downward at the polishing of the back surface 70. With such a shape, the electric field concentration at the corer 76 is further intensified to cause remarkable reduction in a breakdown voltage. The insulating material 63 is formed with an oxide film 80 formed on the sidewall of the isolating trench 62 and polyimide 81 filling the isolating trench 62 with the oxide film 80 interposed between.

In view of the above, it would be desirable to provide a semiconductor device in which an excellent breakdown voltage can be obtained and a manufacturing method of the device.

SUMMARY

A semiconductor device according to the invention has an insulating isolation region including a trench reaching from a first principal surface of a semiconductor substrate to a second principal surface opposite to the first principal surface, an insulating material filling the trench, and an insulator film connected to the insulating material and covering the second principal surface, provided to have an arrangement in which the tip of the insulating material is recessed in a concave shape below the back surface of the second principal surface.

The insulating material is preferably formed with an oxide film. Moreover, it is preferable that the insulating material is formed with an oxide film formed on each of the sidewalls of the trench and polysilicon filling a region interposed between the oxide films.

Furthermore, it is preferable that the device has on the surface layer on the second principal surface side a semiconductor region having a conduction type being the same as the type of the semiconductor substrate and an impurity concentration being higher than the concentration of the semiconductor substrate.

In addition, a method of manufacturing a semiconductor device according to the invention is a method of manufacturing a semiconductor having an insulating isolation region including a trench reaching from a first principal surface of a semiconductor substrate to a second principal surface opposite to the first principal surface, an insulating material filling the trench, and an insulator film connected to the insulating material and covering the second principal surface, in which device the tip of the insulating material is recessed in a concave shape below the second principal surface, which method is provided as a manufacturing method including:

forming an isolating trench from the first principal surface of the semiconductor substrate to a specified depth;

filling the isolating trench with the insulating material;

polishing a surface of the semiconductor on the opposite side of the first principal surface to form the second principal surface and, along with this, expose the insulating material on the second principal surface, and making the tip of the insulating material recessed below the second principal surface after being polished to be in a concave shape; and forming an insulator film on the second principal surface.

The insulator film may be a resinous film of polyimide, an SOG film or an oxide film formed by CVD.

Moreover, the method is provided as a manufacturing method further including the step of forming on the surface layer on the second principal surface side a semiconductor region having a conduction type being the same as the type of the semiconductor substrate and an impurity concentration being higher than the concentration of the semiconductor substrate.

Furthermore, the method is provided as a manufacturing method in which the semiconductor region having the higher impurity concentration is formed by carrying out ion implantation of impurities and by electrically activating the impurities introduced by the ion implantation by laser annealing.

In addition, the method is provided as a manufacturing method in which the semiconductor substrate uses one of an epitaxial wafer, a CZ wafer, an FZ wafer and a diffused wafer.

For a method of providing the shape of the tip of an insulating material filling an isolating trench as being a concave one recessed below the back surface of a semiconductor substrate, there is one which makes selectivity in polishing or etching of the semiconductor substrate controlled so that the selectivity for the material of the semiconductor substrate (silicon) becomes smaller than the selectivity for the insulating material. For the material of the insulating material, a material such as a porous insulating film (an oxide film, for example) formed by CVD (Chemical Vapor Deposition) or a material such as that with an oxide film formed on the inner wall of the isolating trench and polysilicon filling the isolating trench with the oxide film interposed between is more effective than a closely grained thermal oxide film.

By thus providing the shape of the tip of the insulating material as being a concave one recessed below the back surface of the semiconductor substrate, the insulating material can be prevented from being cracked or chipped as was explained with reference to FIG. 15, by which an excellent element breakdown voltage can be obtained.

According to the invention, the shape of the tip of the insulating material of the insulating isolation region is provided as being a concave one recessed below the back surface of a semiconductor substrate. This reduces the electric field strength at the corner at which the bottom of the semiconductor substrate is in contact with the insulating isolation region to allow an excellent breakdown voltage to be obtained.

Moreover, by forming a high impurity concentration region such as a field-stop layer on the back surface of the semiconductor substrate, a depletion layer extending from the top surface is prevented from reaching the back surface. This eliminates an influence of a surface state introduced in the interface between the insulator film formed on the back surface and the semiconductor substrate, by which an excellent breakdown voltage can be obtained.

Furthermore, the same functions as those of an SOI wafer (the function of causing no parasitic effect between elements, for example) can be provided for a semiconductor wafer at a lower process cost compared with that of an ordinary SOI process to allow a semiconductor device with an excellent breakdown voltage to be provided at a reduced cost.

BRIEF DESCRIPTION OF THE DRAWINGS

The invention will be described in detail with reference to certain preferred embodiments thereof and the accompanying drawings, wherein.

DESCRIPTION OF THE PREFERRED EMBODIMENTS

Figure 1A:
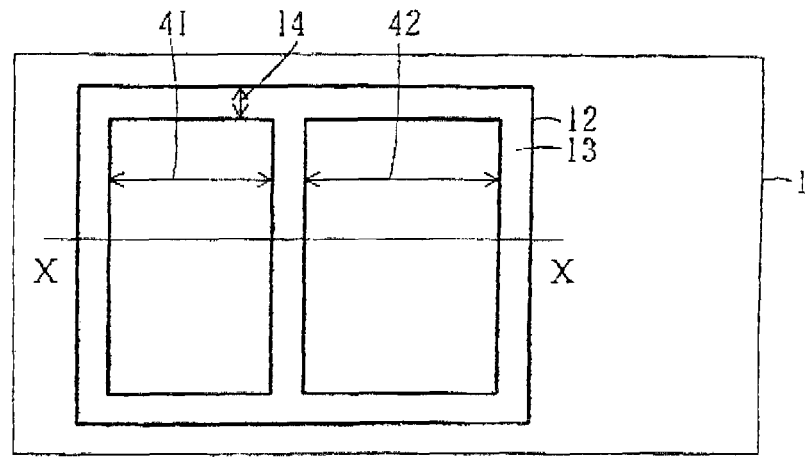
FIG. 1A is a plan view showing an arrangement of a principal part of a semiconductor device of a first example according to the invention.
Figure 1B:
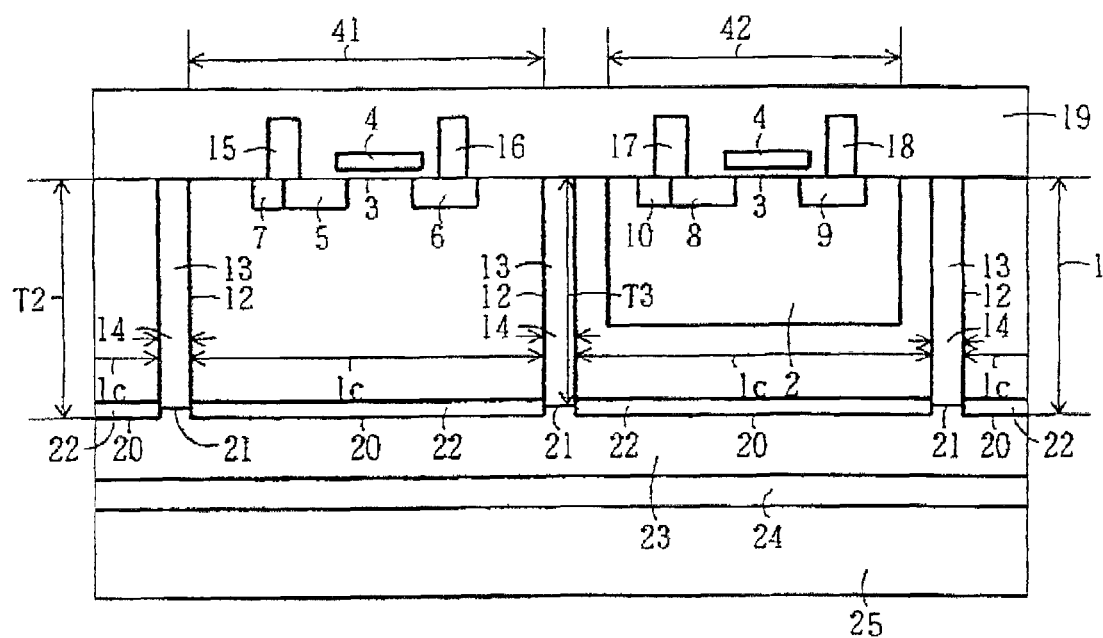
FIG. 1B is a cross sectional view showing an arrangement of the principal part cut along line X-X of FIG. 1A.

FIGS. 1A and 1B are views showing an arrangement of a semiconductor device of a first example according to the invention with FIG. 1A being a plan view showing a principal part and FIG. 1B being a cross sectional view showing the principal part cut along line X-X of FIG. 1A.

The semiconductor device has an n-semiconductor substrate 1 that is divided into divided n-semiconductor substrates 1c by an insulating isolation region 14. On a top surface layer of one divided n-semiconductor substrate 1c, an element such as a p-channel MOSFET 41 is formed together with an unillustrated circuit for driving and protecting the element. On a top surface layer of the other divided n-semiconductor substrate 1c, an element such as an n-channel MOSFET 42 is formed together with an unillustrated circuit for driving and protecting the element. Each of the p-channel MOSFET 41 and the n-channel MOSFET 42 has high impurity concentration regions and metal electrodes. The high impurity concentration regions in the p-channel MOSFET 41 are formed with regions such as a gate electrode 4 of polysilicon, a p-source region 5, a p-drain region 6 and an n-contact region 7. The metal electrodes in the p-channel MOSFET 41 are a source electrode 15 and a drain electrode 16. The high impurity concentration regions in the n-channel MOSFET 42 are formed with regions such as a p-well region 2, a gate electrode 4 of polysilicon, an n-source region 8, an n-drain region 9 and a p-contact region 10. The metal electrodes in the n-channel MOSFET 42 are a source electrode 17 and a drain electrode 18. The insulating isolation region 14 insulates the elements from each other, the circuits from each other and the elements from the circuits. On a back surface 20 of the n-semiconductor substrate 1, an insulator film 23 is formed. In FIG. 1B, an interlayer insulator film 19 also serving as a cap layer covering the top surface, a metal substrate 25 supporting the n-semiconductor substrate 1, and a conductive adhesive 24 for fixing them are also shown.

The insulating isolation region 14 is formed by filling an isolating trench 12 with insulating material 13. The insulating material 13 at the bottom of the insulating isolation region 14 is recessed in a concave shape below the back surface 20 of the semiconductor substrate 1. The insulating material 13 in the recess is connected to the insulator film 23 formed on the back surface 20 side to surround the divided n-semiconductor substrate 1c with the insulating material 13 and the insulator film 23 formed on the back surface 20.

Moreover, the insulator film 23 is formed on an n-field-stop layer 22 formed over the whole region of the back surface 20 of the divided n-semiconductor substrate 1c. The insulator film 23 is made fixed to the metal substrate 25 with the conductive adhesive 24 set between. By thus forming the field-stop layer 22 over the whole region of the back surface 20 of the divided n-semiconductor substrate 1c, no depletion layer extending from the element formed on the top surface of the divided n-semiconductor substrate 1c reaches the back surface 20 of the divided n-semiconductor substrate 1c. Thus, an excellent breakdown voltage can be obtained.

In FIG. 1B, a character T2 represents the thickness of the divided n-semiconductor substrate 1c at completion, which is from 10 μm to hundreds of micrometers. The thickness T2 depends on the breakdown voltage of the semiconductor device. Therefore, the higher the breakdown voltage is, the larger the thickness becomes.

Next, explanations will be made about a method of manufacturing the semiconductor device shown in FIGS. 1A and 1B.

FIGS. 2 to 6 are cross sectional views showing a method of manufacturing the first example of the semiconductor device shown in FIGS. 1A and 1B, in which views the manufacturing steps are shown in the order about a principal part of the semiconductor device.

Figure 2:
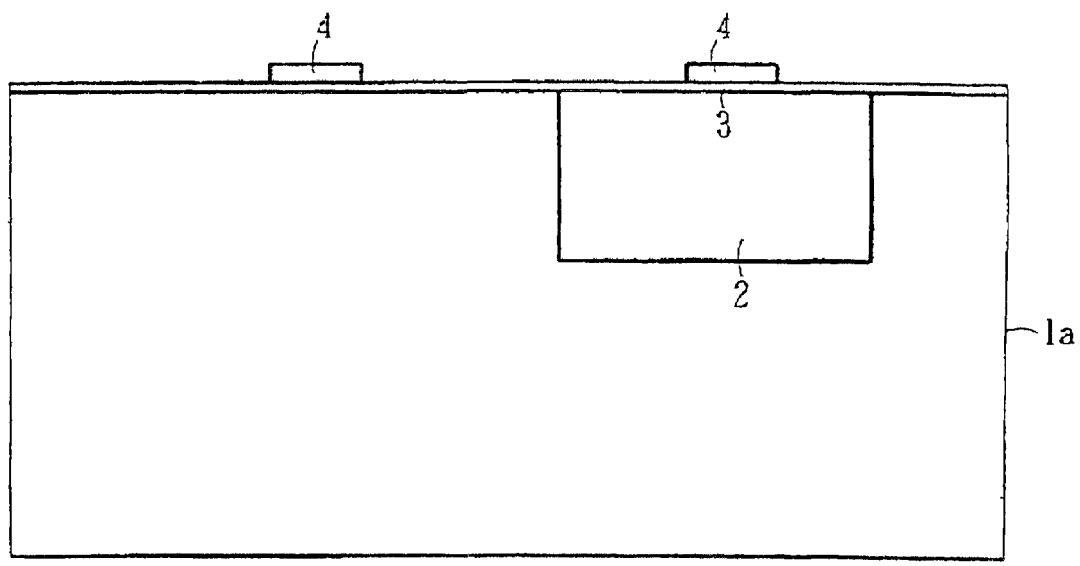
FIG. 2 is a is a cross sectional view showing the principal part of the semiconductor device shown in FIGS. 1A and 1B at the first manufacturing step.

As the first manufacturing step, as shown in FIG. 2, in the top surface layer of an n-semiconductor substrate 1a of an n-type CZ wafer with a resistivity of several ohm-centimeters, the well region 2 is formed with p-type impurities with a dose of the order of $1 \times 10^{13}$ cm$^{-2}$, for example. Then, on the top surface of the n-semiconductor substrate 1a, a gate insulator film 3 is formed with a thickness of the order of tens of nanometers on the top surface of the n-semiconductor substrate 1a. On the gate insulator film 3, the gate electrodes 4 are formed with polysilicon.

Figure 3:
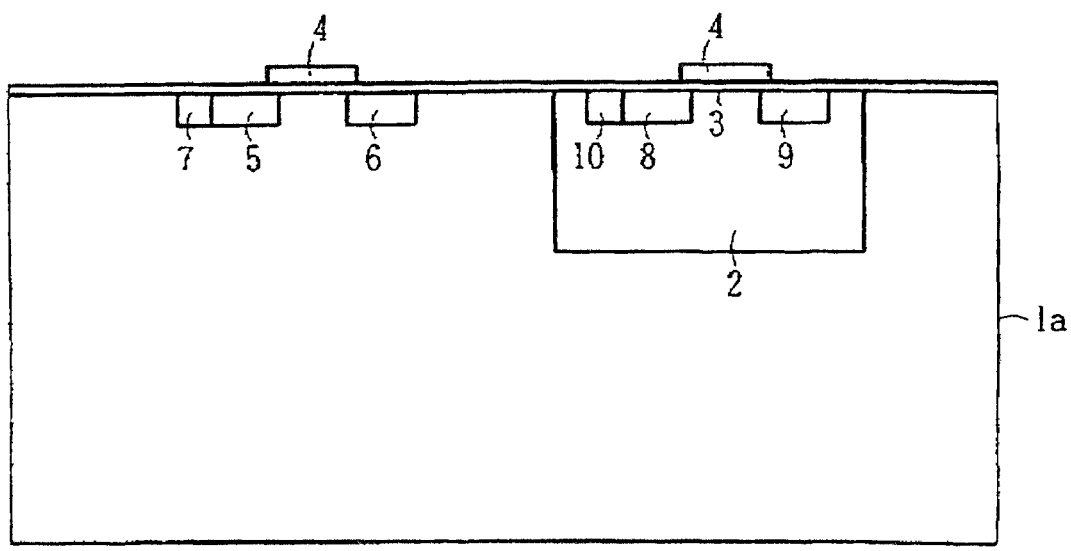
FIG. 3 is a cross sectional view showing the principal part of the semiconductor device shown in FIGS. 1A and 1B at the manufacturing step subsequent to the first manufacturing step shown in FIG. 2.

Next to this, as shown in FIG. 3, high impurity concentration regions such as the p-source region 5, the p-drain region 6, the n-contact region 7, the n-source region 8, the n-drain region 9 and the p-contact region 10 are formed.

Figure 4:
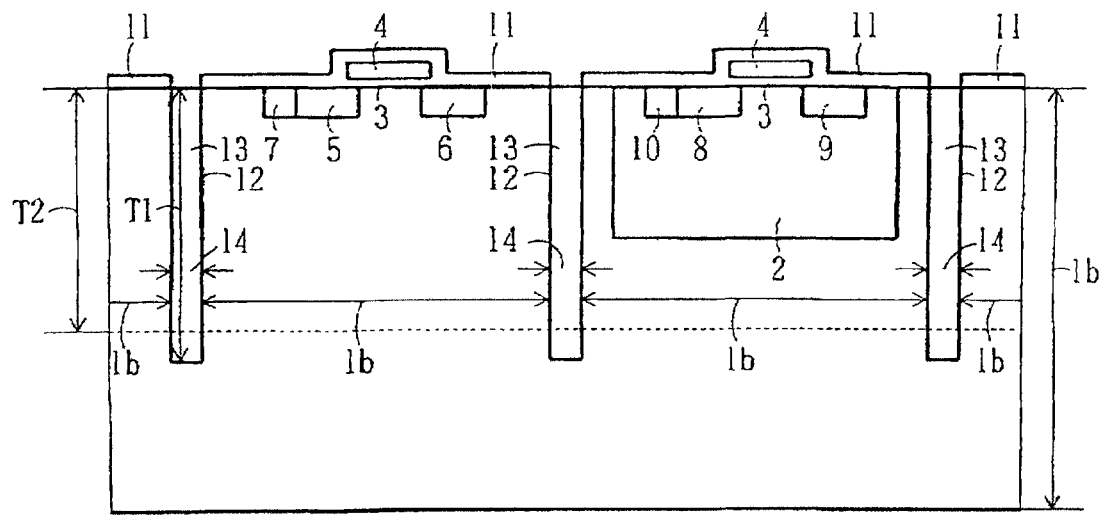
FIG. 4 is a cross sectional view showing the principal part of the semiconductor device shown in FIGS. 1A and 1B at the manufacturing step subsequent to the step shown in FIG. 3.

Following this, as shown in FIG. 4, the top surface of the n-semiconductor substrate 1a is coated with an interlayer insulator film 11, which is subjected to patterning to form the isolating trench 12, by which the top surface layer of the n-semiconductor substrate 1a is partitioned to form partitioned n-semiconductor substrates 1b. The isolating trench 12 is filled with the insulating material 13 to form the insulating isolation region 14. For a method of filling the isolating trench 12 with the insulating material 13, there is, for example, a method in which the isolating trench 12 is filled with an oxide film produced by plasma-assisted CVD, or a method in which the sidewall and the bottom of the isolating trench 12 are coated with an oxide film produced by plasma-assisted CVD and the isolating trench 12 is then filled with a filling material such as polysilicon with the coated oxide film interposed between. For a material of a masking film applied when the isolating trench 12 is formed, a resist is well used. The depth T1 of the isolating trench 12 at this time is made larger than the thickness T2 of the n-semiconductor substrate 1 at the completion of the semiconductor device. A difference T1–T2 is desirably on the order of 0 to 5 μm with variations in a wafer surface taken into consideration which are such as those caused in etching the back surface of the n-semiconductor substrate 1a (FIG. 4).

Subsequent to this, a metal electrode of the source electrode 15 is formed on the high impurity concentration regions of the p-source region 5 and the n-contact region 7, and a metal electrode of the drain electrode 16 is formed on the high impurity concentration region of the p-drain region 6. Moreover, a metal electrode of the source electrode 17 is formed on the high impurity concentration regions of the n-source region 8 and the p-contact region 10, and a metal electrode of the drain electrode 18 is formed on the high impurity concentration region of the n-drain region 9. Furthermore, the interlayer insulator film 19 is formed on the top surface of the partitioned n-semiconductor substrate 1b. Here, the interlayer insulator film 19 is formed as one layer including the interlayer insulator film 11 for the n-semiconductor substrate 1 and the metal electrodes and also serving as a cap layer on the metal electrodes. Subsequent to this, the partitioned n-semiconductor substrate 1b is made thinned from the back surface by polishing or etching to the thickness T2 to expose the insulating material 13, by which the thin n-semiconductor substrate 1 is provided. The thickness of the n-semiconductor substrate 1 is the above-described T2. The n-semiconductor substrate 1 is an assembly in which a plurality of the divided n-semiconductor substrates 1c divided by the insulating isolation region 14 are assembled together. The polishing step is well carried out by two stages of a comparatively rough mechanical polishing step and a chemical polishing step of removing mechanical strain.

Figure 5:
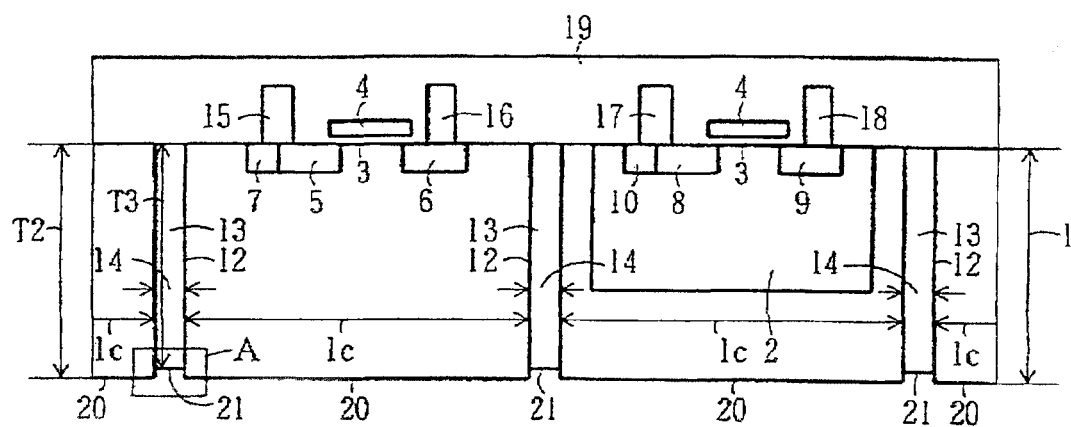
FIG. 5 is a cross sectional view showing the principal part of the semiconductor device shown in FIGS. 1A and 1B at the manufacturing step subsequent to the step shown in FIG. 4.
Figure 7:
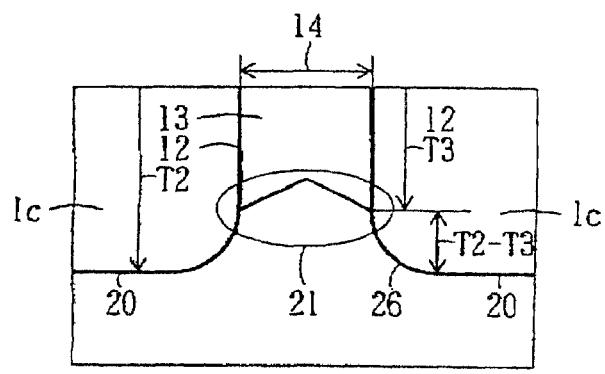
FIG. 7 is an enlarged view of the section A in FIG. 5.

In the chemical polishing step, by setting the selectivity for the semiconductor substrate material (silicon) to be smaller than the selectivity for the insulating material, the shape of the insulating material 13 at the bottom of the insulating isolation region 14, as shown in FIG. 7 as an enlarged view of the section A in FIG. 5, becomes a concave one recessed below the back surface 20 of the n-semiconductor substrate 1. Moreover, a corner 26 of the divided n-semiconductor substrate 1c in the vicinity of the bottom is rounded to reduce electric field concentration at the section to enable prevention of reduction in a breakdown voltage.

Instead of the chemical polishing step, a CMP (Chemical Mechanical Polishing) step can be also used for obtaining the same shape. The difference between the thickness T2 of the n-semiconductor substrate 1 and the length T3 of the insulating material 13 to a tip 21 thereof from the top surface of the n-semiconductor substrate 1, (T2–T3), is desirably several micrometers (of the order of 0.1 μm to 3 μm) (FIG. 5).

Following this, the n-field-stop layer 22 with an impurity concentration higher than that of the divided n-semiconductor substrate 1c is formed over the whole area of the back surface 20 of each of the divided n-semiconductor substrates 1c. This is for preventing a depletion layer, extending from the element formed on the top surface of the divided n-semiconductor substrate 1c, from reaching the insulator film 23 formed on the back surface 20 of the divided n-semiconductor substrate 1c. The n-field-stop layer 22 is formed by implanting n-type dopant ions (ions of an n-type impurity to be doped) into the back surface 20 of the thinned n-semiconductor substrate 1 by ion implantation and by carrying out low temperature annealing or laser annealing for activation. The low temperature annealing is carried out at a low temperature (of the order of 500° C.) that causes no deterioration of metal electrodes of the source electrodes 15 and 17 and the drain electrodes 16 and 18.

The dose of the dopant ions is determined by a voltage that causes punch through of the n-field-stop layer 22 (a punch through voltage).

In the previously explained manufacturing process steps, by exchanging the step of forming high impurity concentration regions such as the source regions 5 and 8 and the drain regions 6 and 9 as shown in FIG. 3 for the step of forming the isolating trench 12, damages are made recovered which were introduced in the n-semiconductor substrate 1 when forming the isolating trench 12. Thus, by thereafter carrying out the formation of the high impurity concentration regions such as the source regions 5 and 8 and the drain regions 6 and 9 shown in FIG. 3, excellent MOSFET characteristics can be ensured. In this case, after the isolating trench 12 is formed, a resist as a masking material for forming the trench is removed with the gate insulator film 3 (an oxide film) being left behind and heat treatment at a high temperature is then carried out. This allows damages to be absorbed in the gate insulator film 3 to thereby make the damages recovered. Thereafter, the isolating trench 12 is filled with the insulating material 13. Then, the high impurity concentration regions such as the source regions 5 and 8 and the drain regions 6 and 9 are formed as was explained before.

Figure 8:
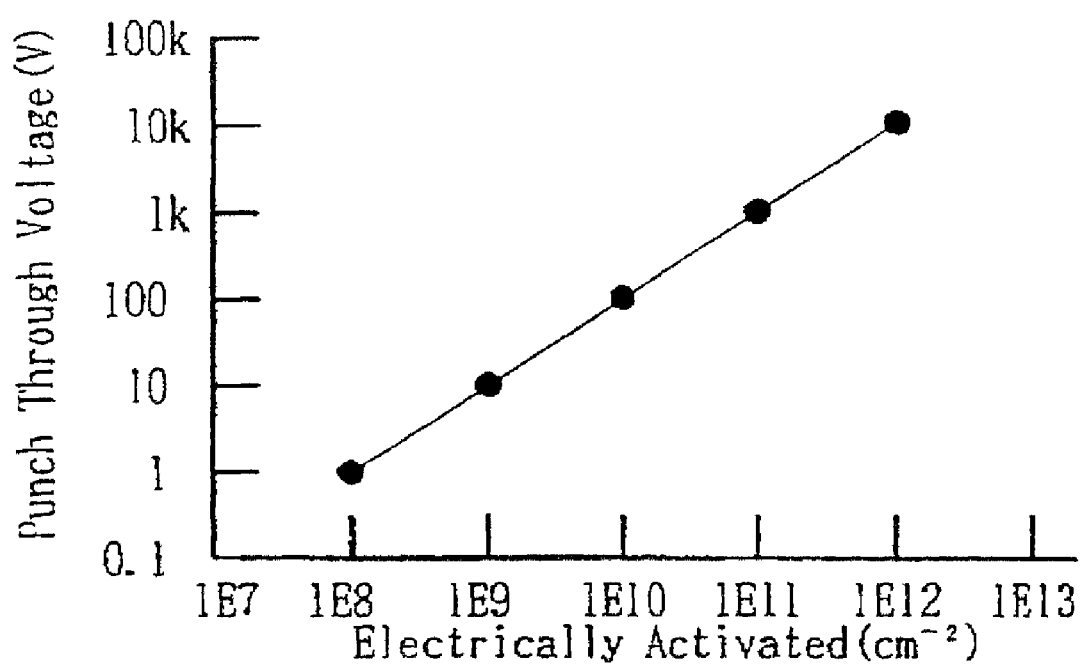
FIG. 8 is a diagram showing a relationship between the dose of a dopant and a punch through voltage.

FIG. 8 is a diagram showing a relationship between the dose of a dopant and a punch through voltage. A coded numeral on the horizontal axis such as 1E8, for example, expresses $1 \times 10^8$. From FIG. 8, it is known that a dose is well determined within the range from $1 \times 10^8$ (1E8)$cm^{-2}$ to $1 \times 10^{12}$ (1E12)$cm^{-2}$ when a punch through voltage is set within the range from 1V to 10 kV. Moreover, the insulator film 23 is formed on the back surface 20 of the divided n-semiconductor substrate 1c so as to be made in contact with the insulating material 21. To the material of the insulator film 23, insulating materials such as an oxide film formed by ordinary temperature plasma-assisted CVD, SOG (spin-on-glass) including silicon oxide and organic material such as polyimide can be applied.

Figure 6:
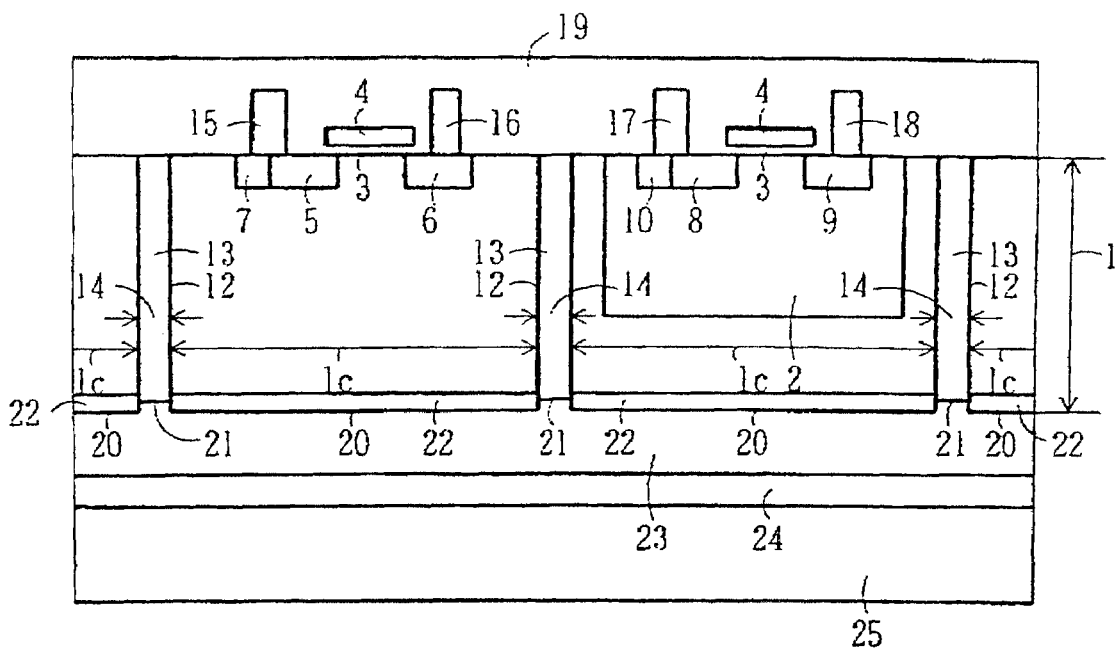
FIG. 6 is a cross sectional view showing the principal part of the semiconductor device shown in FIGS. 1A and 1B at the final manufacturing step.

Finally, the insulator film 23 is bonded to the metal substrate 25 with the conductive adhesive 24 applied between, by which the semiconductor device is completed (FIG. 6). An epoxy adhesive used instead of the insulator film 23 and the conductive adhesive 24 serves for insulation of the back surface 20 of the divided n-semiconductor 1c and adhesive bonding to the metal substrate 25. Moreover, instead of the metal substrate 25, an insulating substrate such as a ceramic substrate can be used.

Here, the n-semiconductor substrate 1a was explained as a CZ (Czochralski Zone) wafer. The substrate, however, can be an epitaxial wafer, an FZ (Floating Zone) wafer or a diffused wafer.

With the use of the manufacturing method, a wafer with the same function as that of an SOI wafer (with no parasitic effect between elements, for example) and an excellent breakdown voltage can be obtained at a lower process cost compared with that of a related SOI process.

Figure 9A:
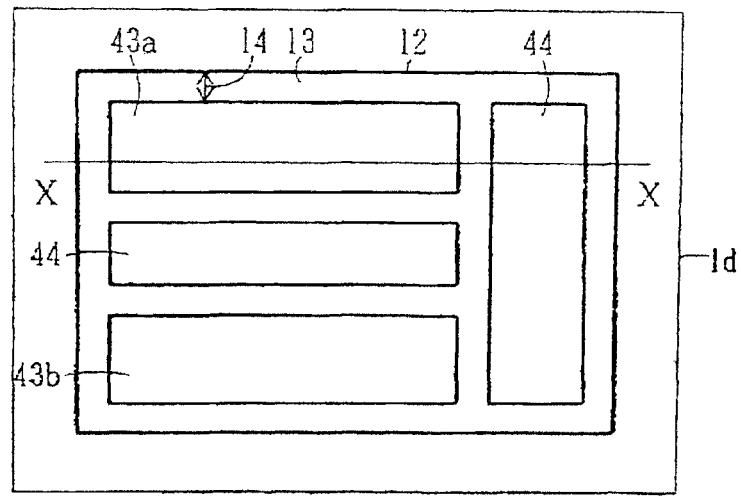
FIG. 9A is a plan view showing an arrangement of a principal part of a semiconductor device of a second example according to the invention.
Figure 9B:
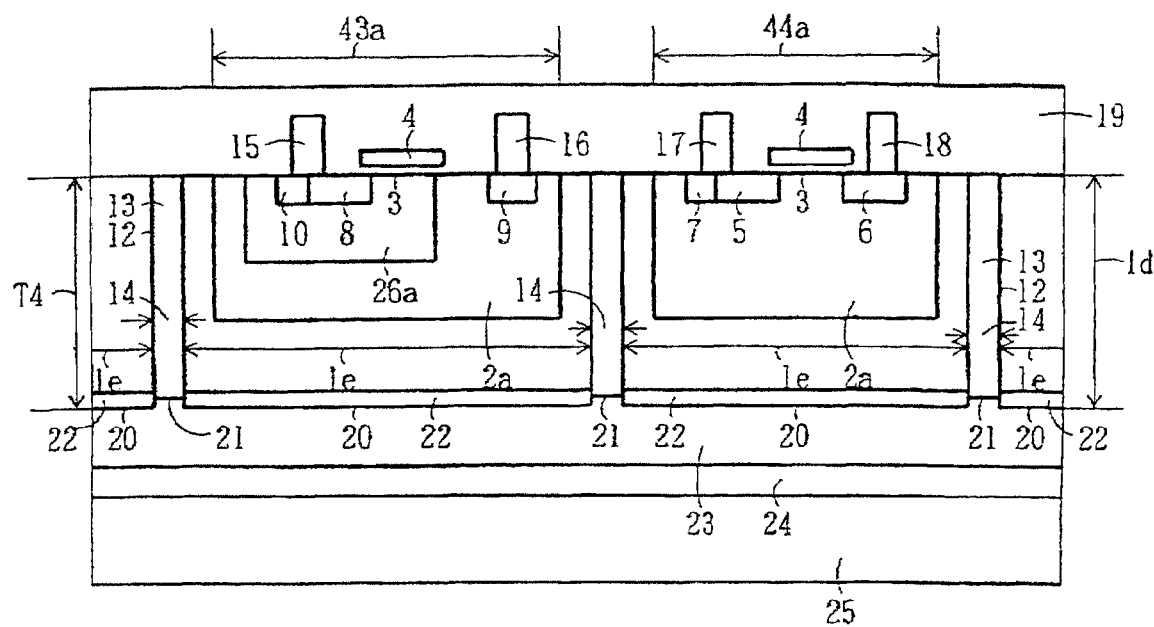
FIG. 9B is a cross sectional view showing an arrangement of the principal part cut along line X-X of FIG. 9A.

FIGS. 9A and 9B are views showing an arrangement of a semiconductor device of a second example according to the invention with FIG. 9A being a plan view showing a principal part and FIG. 9B being a cross sectional view showing the principal part cut along line X-X of FIG. 9A. The device is a CMOS circuit element to which the invention is applied and includes output stage lateral MOSFETs 43a and 43b and a circuit section 44.

On a p-semiconductor substrate 1d, the output stage lateral n-channel MOSFETs 43a and 43b on the high side and the circuit section 44 are formed while being laterally isolated one another by an insulating isolation region 14. For simplicity here, in FIG. 9B, the output stage lateral n-channel MOSFETs 43a (with a breakdown voltage of 60V) are shown about one cell thereof and the circuit section 44 is shown about one element of p-channel MOSFETs 44a (with a breakdown voltage of 7V). The basic manufacturing steps are the same as those shown in FIGS. 2 to 6.

With the use of a CZ-p-semiconductor substrate with a resistivity of the order of several ohm centimeters, in the top surface layer of the p-semiconductor substrate (to be the p-semiconductor substrate 1d after polishing), n-well regions 2a having a depth of the order of 2.0 µm to 3.0 µm are formed with a dose of the order of $5 \times 10^{12}$ cm$^{-2}$ and p-well regions 26a having a depth of the order of 1.5 µm to 2.0 µm are formed with a dose of the order of $1 \times 10^{13}$ cm$^{-2}$.

On the top surface, a gate insulator film 3 is then formed with a thickness of the order of tens of nanometers, on which gate electrodes 4 are formed with polysilicon. Moreover, an isolating trench 12 is formed to partition the top surface layer of the p-semiconductor substrate (to be the p-semiconductor substrate 1d after polishing). The isolating trench 12 is then filled with insulating material 13. Furthermore, high impurity concentration regions of an n-source region 8, an n-drain region 9 and a p-contact region 10 are formed on a region of each cell of the output stage lateral n-channel MOSFETs 43a and 43b. In addition, high impurity concentration regions of a p-source region 5, a p-drain region 6 and an n-contact region 7 are formed on a region of each element of the p-channel MOSFETs 44a.

On the top surface of the p-semiconductor substrate, an unillustrated interlayer insulator film (to be included in a later formed interlayer insulator film 19) is formed, in which contact holes are opened. Then, metal electrodes to be a source electrode 15 and a drain electrode 16 are formed on a region of each cell of the output stage lateral n-channel MOSFETs 43a and 43b through the contact holes. In addition, metal electrodes to be a source electrode 17 and a drain electrode 18 are formed on a region of each element of the p-channel MOSFETs 44a. Furthermore, over the unillustrated insulator film and the metal electrodes, the interlayer insulator film 19 also serving as a cap layer is formed.

The back surface of the p-semiconductor substrate is then subjected to polishing and etching, by which the p-semiconductor substrate is made thinned until the thickness T4 of the p-semiconductor substrate 1d becomes 100 µm. By controlling etching selectivity, the insulating material 13 is recessed in a concave shape below the back surface 20 of the p-semiconductor substrate 1d. The insulating material 13 in the recess is connected to an insulator film 23 formed on the side of a back surface 20 to surround the side surface and the bottom surface of a divided p-semiconductor substrate 1e with the insulating material 13 and the insulator film 23 on the back surface 20. The insulator film 23 is an oxide film formed by ordinary temperature plasma-assisted CVD. The insulator film 23 can be formed by using an SOG (Spin on Glass) containing polyimide or silicon oxide. With the insulator film 23 bonded to a metal substrate 25 with a conductive adhesive 24 applied between, the semiconductor device is completed.

By making a tip 21 of the insulating material 13 recessed below the back surface 20 of the semiconductor substrate 1d to give a concave shape, an effect similar to that of the first example can be obtained.

Figure 10A:
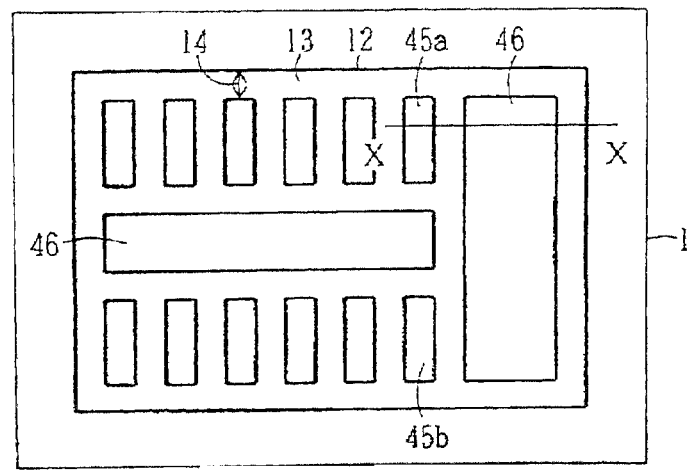
FIG. 10A is a plan view showing an arrangement of a principal part of a semiconductor device of a third example according to the invention.
Figure 10B:
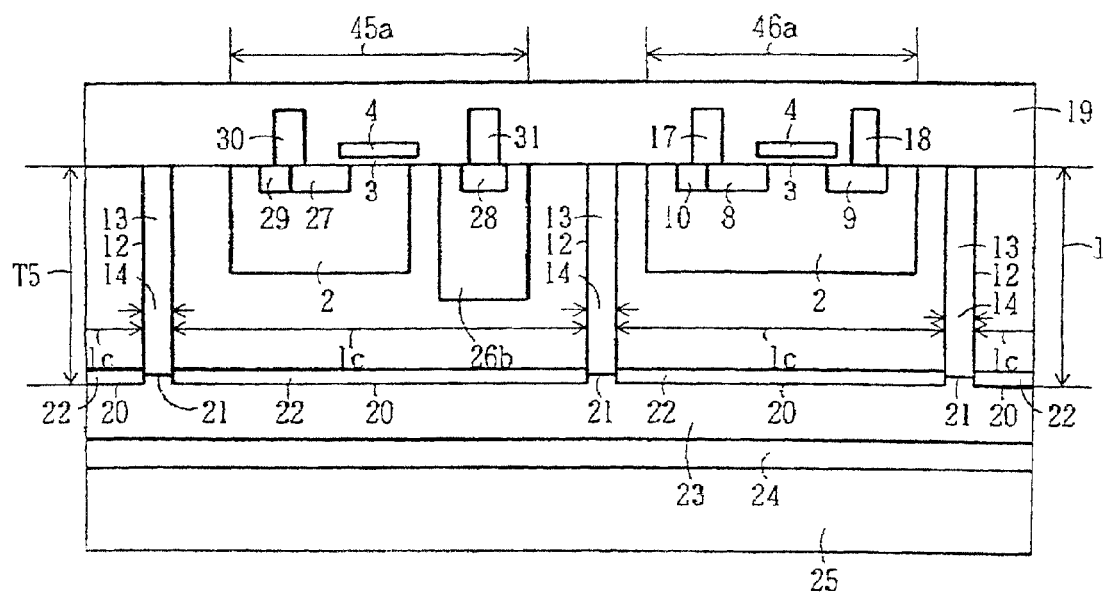
FIG. 10B is a cross sectional view showing an arrangement of the principal part cut along line X-X of FIG. 10A.
Figure 11:
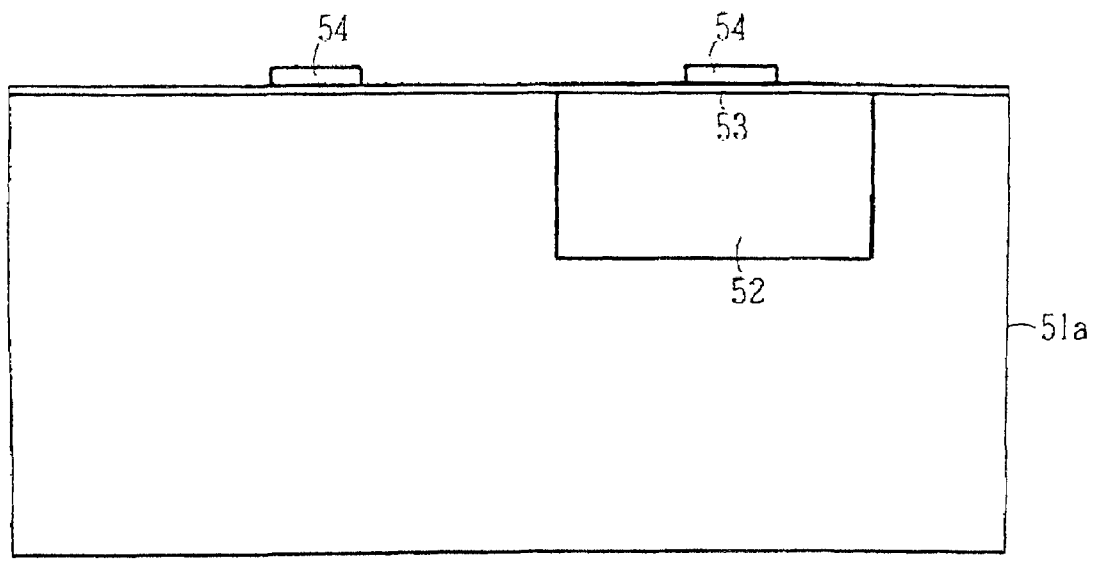
FIG. 11 is a is a cross sectional view showing a principal part of a related semiconductor device having an isolation structure at the first manufacturing step.
Figure 12:
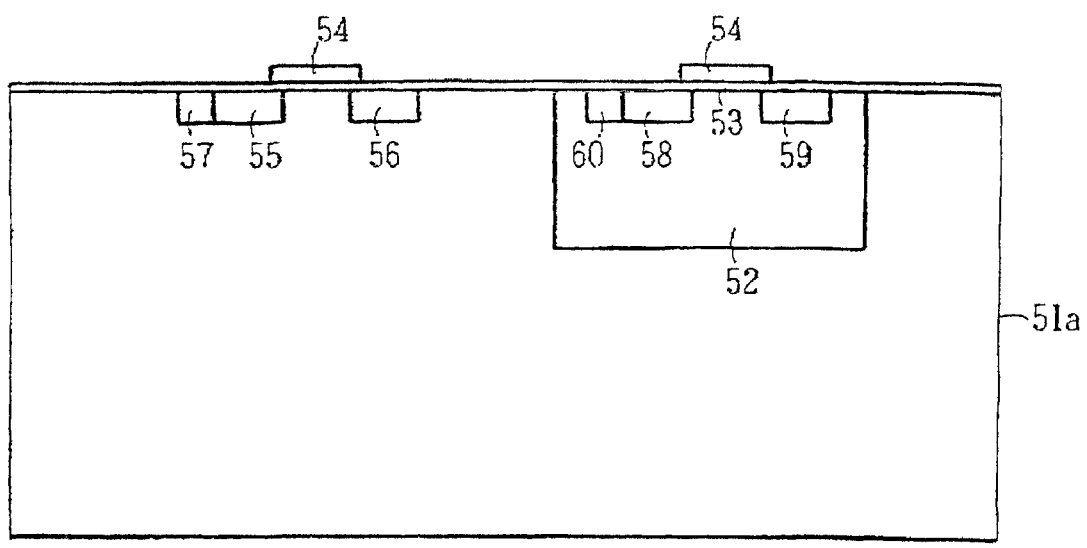
FIG. 12 is a cross sectional view showing the principal part of the related semiconductor device having an isolation structure at the manufacturing step subsequent to the first manufacturing step shown in FIG. 11.
Figure 13:
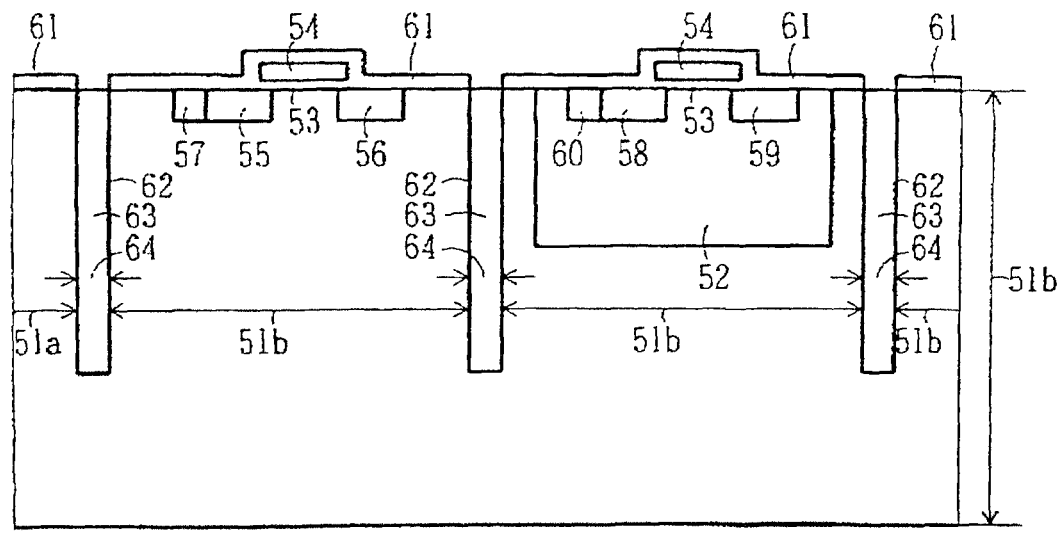
FIG. 13 is a cross sectional view showing the principal part of the related semiconductor device having an isolation structure at the manufacturing step subsequent to the step shown in FIG. 12.
Figure 14:
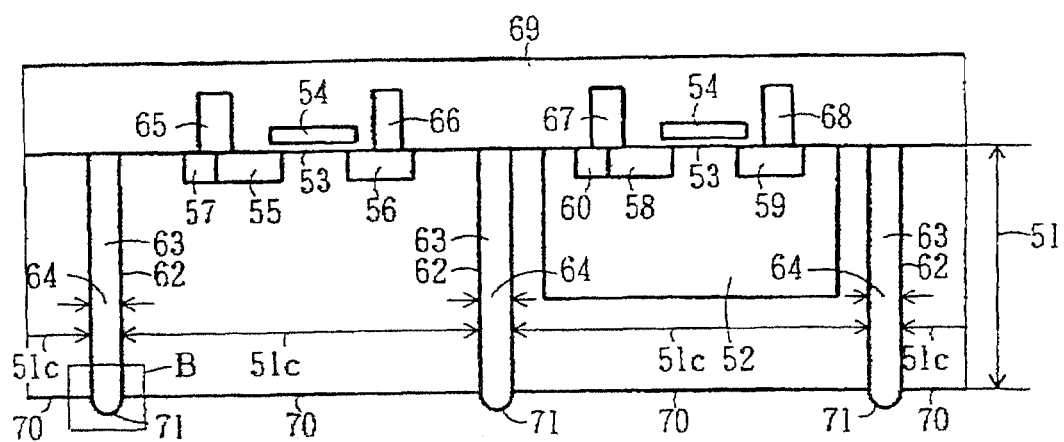
FIG. 14 is a cross sectional view showing the principal part of the related semiconductor device having an isolation structure at the manufacturing step subsequent to the step shown in FIG. 13.
Figure 15:
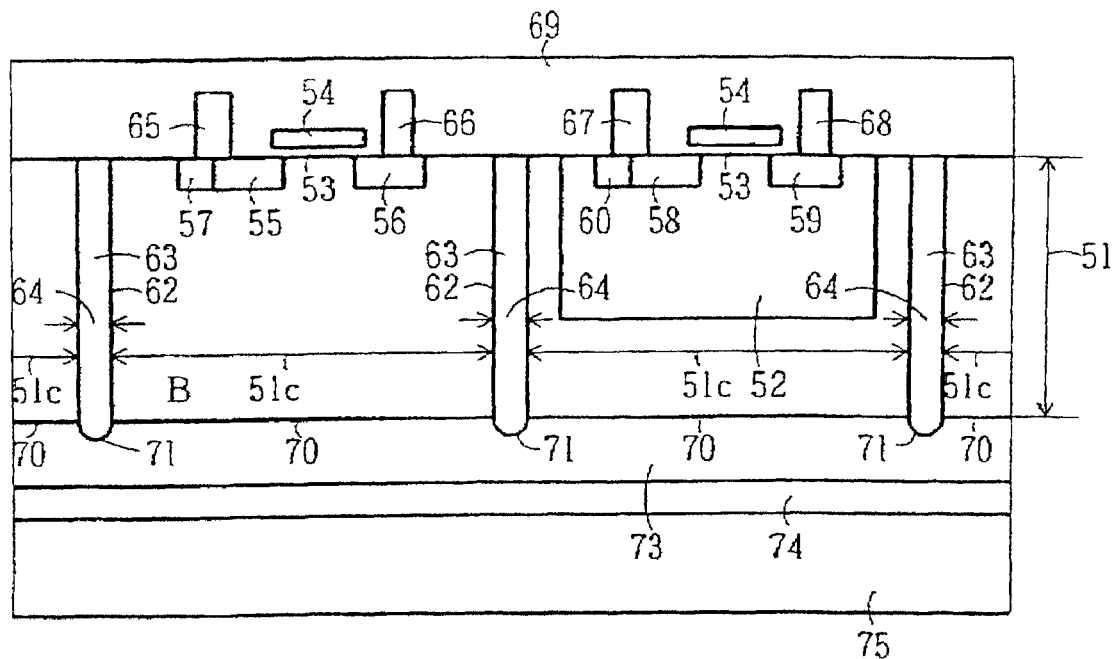
FIG. 15 is a cross sectional view showing the principal part of the related semiconductor device having an isolation structure at the final manufacturing step.
Figure 16:
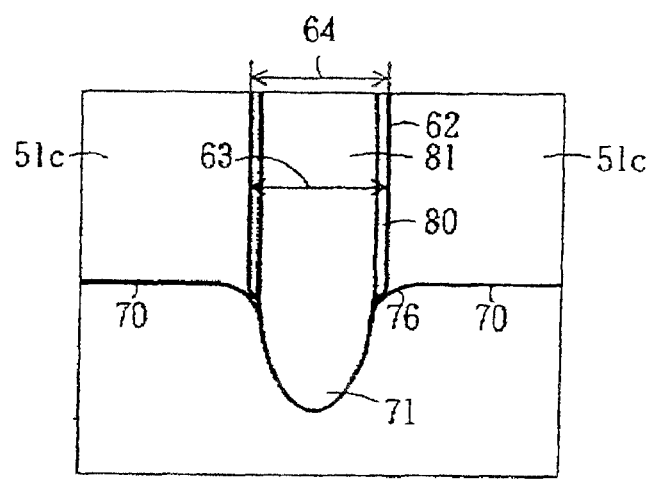
FIG. 16 is an enlarged view of the section A in FIG. 14.

FIGS. 10A and 10B are views showing an arrangement of a semiconductor device of a third example according to the invention with FIG. 10A being a plan view showing a principal part and FIG. 10B being a cross sectional view showing the principal part cut along line X-X of FIG. 10A. The device is a plasma display panel driving IC element to which the invention is applied and includes lateral n-channel IGBTs 45a and 45b and a circuit sections 46.

The semiconductor device has a structure in which the lateral n-channel IGBTs 45a each being as an upper arm element of a totem-pole circuit, the lateral n-channel IGBTs 45b each being as a lower arm element of the same circuit and the circuit sections 46 are arranged on an n-semiconductor substrate 1 while being laterally isolated by an insulating isolation region 14. For simplicity here, in FIG. 10B, the lateral n-channel IGBTs 45a (with a breakdown voltage of 200V) are shown about one cell thereof and n-channel MOSFETs 46a (with a breakdown voltage of 7V) forming the circuit section 46 are shown about one element thereof. The basic manufacturing steps are the same as those shown in FIGS. 2 to 6.

With the use of a CZ-n-semiconductor substrate 1 with a resistivity of the order of 10Ωsm, in the top surface of the n-semiconductor substrate 1, an n-buffer region 26b having a depth of the order of 2.0 µm to 3.0 µm is formed with a dose of the order of $1 \times 10^{13}$ cm$^{-2}$ and p-well regions 2 having a depth of the order of 1.5 µm to 2.0 µm are formed with a dose of the order of $7 \times 10^{12}$ cm$^{-2}$. On the top surface, a gate insulator film 3 is then formed with a thickness of the order of tens of nanometers, on which gate electrodes 4 are formed with polysilicon. Moreover, an isolating trench 12 is formed on the top surface layer of the n-semiconductor substrate 1 to partition the top surface layer of the n-semiconductor substrate 1. The isolating trench 12 is then filled with insulating material 13 to be formed as the insulating isolation layer 14. Furthermore, high impurity concentration regions of an n-emitter region 27, a p-collector region 28 and a p-contact region 29 are formed on a region of each cell of the lateral n-channel IGBTs 45a and 45b. In addition, high impurity concentration regions of an n-source region 8, an n-drain region 9 and a p-contact region 10 are formed on a region of each element of the p-channel MOSFETs 46a. On the top surface of the n-semiconductor substrate 1, an unillustrated interlayer insulator film (to be included in a later formed interlayer insulator film 19) is formed, in which contact holes are opened. Then, metal electrodes to be an emitter electrode 30 and a collector electrode 31 are formed on a region of each cell of the lateral n-channel IGBTs 45a and 45b through the contact holes. In addition, metal electrodes to be a source electrode 17 and a drain electrode 18 are formed on a region of each element of the n-channel MOSFETs 46a through the contact holes. Furthermore, over the unillustrated insulator film and the metal electrodes, the interlayer insulator film 19 also serving as a cap layer is formed.

The back surface 20 of the n-semiconductor substrate 1 is then subjected to polishing and etching, by which the n-semiconductor substrate 1 is made thinned until the thickness T5 of the n-semiconductor substrate 1 becomes 10 µm. By controlling etching selectivity, the insulating material 13 is recessed in a concave shape below the back surface 20 of the n-semiconductor substrate 1. The insulating material 13 in the recess is connected to an insulator film 23 formed on the back surface 20 side to surround the side surface and the bottom surface of a divided n-semiconductor substrate 1c with the insulating material 13 and the insulator film 23 on the back surface 20. The insulator film 23 is an oxide film formed by ordinary temperature plasma-assisted CVD. The insulator film 23 can be formed by using an SOG containing polyimide or silicon oxide. With the insulator film 23 bonded to a metal substrate 25 with a conductive adhesive 24 applied between, the semiconductor device is completed.

In the case of a bipolar element such as an IGBT, an n-semiconductor substrate 1 with a thickness T5 made increased causes an increase in the amount of carriers subjected to conductivity modulation to degrade a turn-off loss and response characteristics. Thus, the element is normally designed so that the thickness T5 of the n-semiconductor substrate 1 is reduced to allow a depletion layer to reach the back surface 20 of the n-semiconductor substrate 1. Moreover, when the back surface 20 of the n-semiconductor substrate 1 is polished, the n-semiconductor substrate 1 with the thickness T5 made reduced to be smaller than tens of micrometers becomes to easily generate cracks in the n-semiconductor substrate (wafer) 1 in process. Therefore, the polishing is well carried out with an unillustrated supporting substrate for preventing the wafer from generating cracks adhered to the surface of the interlayer insulator film 19. For forming field-stop layers 22 on the back surface 20 of the n-semiconductor substrate 1, ion implantation of phosphorus ions with a dose of $5 \times 10^{11}$ cm$^{-2}$ is carried out with followed activation by laser annealing. The insulator film 23 is an oxide film formed by ordinary temperature plasma-assisted CVD. The insulator film 23 can be formed by using polyimide or an SOG containing silicon oxide. With the insulator film 23 bonded to a metal substrate 25 with a conductive adhesive 24 applied between, the semiconductor device is completed.

By making the tip 21 of the insulating material 13 recessed below the back surface 20 of the n-semiconductor substrate 1 to give a concave shape, an effect similar to that of the first example can be obtained.

While the present invention has been particularly shown and described with reference to preferred embodiments thereof, it will be understood by those skilled in the art that the foregoing and other changes in form and details can be made therein without departing from the spirit and scope of the present invention.

What is claimed is:

1. A semiconductor device having an insulating isolation region comprising:
   a semiconductor substrate;
   a trench reaching from a first principal surface of the semiconductor substrate to a second principal surface opposite to the first principal surface;
   an insulating material filling the trench; and
   an insulator film connected to the insulating material and covering the second principal surface;
   wherein a tip of the insulating material is recessed within the trench in a concave shape below a back surface of the second principal surface.

2. The semiconductor device as claimed in claim 1 wherein the insulating material comprises an oxide film.

3. The semiconductor device as claimed in claim 1 wherein the insulating material comprises an oxide film formed on each of the sidewalls of the trench and polysilicon filling a region interposed between the oxide films.

4. The semiconductor device as claimed in claim 1 wherein the device has on the surface layer on the second principal surface side a semiconductor region having a conduction type being the same as the type of the semiconductor substrate and an impurity concentration being higher than the concentration of the semiconductor substrate.

5. The semiconductor device as claimed in claim 1, wherein the insulator film extends into the trench and directly contacts the concaved shape tip of the insulating material.

6. The semiconductor device as claimed in claim 1, wherein a corner of the semiconductor substrate located at the intersection of the trench and the bottom surface is rounded.

* * * * *